United States Patent
Lim et al.

(10) Patent No.: US 12,368,022 B2
(45) Date of Patent: Jul. 22, 2025

(54) RF GENERATING DEVICE AND SEMICONDUCTOR MANUFACTURING APPARATUS INCLUDING THE SAME

(71) Applicant: SAMSUNG ELECTRONICS CO., LTD., Suwon-si (KR)

(72) Inventors: Sungyong Lim, Suwon-si (KR); Sungyeol Kim, Suwon-si (KR); Yongwon Cho, Suwon-si (KR); Younghwan Choi, Suwon-si (KR); Chunyoon Park, Suwon-si (KR); Seungbo Shim, Suwon-si (KR); Hyungjung Yong, Suwon-si (KR); Jaejoong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 265 days.

(21) Appl. No.: 17/970,242

(22) Filed: Oct. 20, 2022

(65) Prior Publication Data

US 2023/0118000 A1 Apr. 20, 2023

(30) Foreign Application Priority Data

Oct. 20, 2021 (KR) .................. 10-2021-0140492
Jun. 20, 2022 (KR) .................. 10-2022-0075018

(51) Int. Cl.
*H01J 37/32* (2006.01)
*H03H 7/38* (2006.01)

(52) U.S. Cl.
CPC ... *H01J 37/32183* (2013.01); *H01J 2237/327* (2013.01)

(58) Field of Classification Search
CPC .............. H01J 37/32; H01J 37/32146; H01J 37/32165; H01J 37/32174;
(Continued)

(56) References Cited

U.S. PATENT DOCUMENTS 7,932,776 B2 4/2011 Sorrells et al.
9,748,076 B1 * 8/2017 Choi .................. H01J 37/32183
(Continued)

FOREIGN PATENT DOCUMENTS

KR 10-2020-0059310 A 5/2020
KR 10-2020-0121909 A 10/2020

*Primary Examiner* — Thai Pham
(74) *Attorney, Agent, or Firm* — Sughrue Mion, PLLC

(57) ABSTRACT

A radio frequency (RF) generating device for generating RF output signals is provided. The RF generating device includes: a controller configured to generate an RF control signal and a gain control signal; a plurality of RF signal generators, each RF signal generator being configured to generate an RF signal having at least one of a frequency and a phase determined based on the RF control signal; a plurality of RF amplification modules, each RF amplification module being configured to receive the RF signal generated by a corresponding RF signal generator and generate an RF amplification signal by controlling a gain of the RF signal based on the gain control signal; an RF switch module configured to select at least one of the RF amplification signals generated by the RF amplification modules and generate an RF output signal in a form of a multi-level pulse based on the selected at least one of the RF amplification signals; and an impedance converter connected to an electrode of an external load and configured to convert a load impedance into a target impedance having a target range, the load impedance being an impedance of the external load.

17 Claims, 12 Drawing Sheets

(58) Field of Classification Search
CPC ........... H01J 37/32183; H01J 37/32082; H01J 2237/327; H01J 7/38; H03H 7/40
See application file for complete search history.

(56) References Cited

U.S. PATENT DOCUMENTS

| | | |
|---|---|---|
| 10,090,772 B2 | 10/2018 | Perreault et al. |
| 10,264,663 B1 | 4/2019 | Long et al. |
| 10,638,593 B2 | 4/2020 | Long et al. |
| 10,672,590 B2 | 6/2020 | Long et al. |
| 10,903,049 B2* | 1/2021 | Higuchi ............ H01J 37/32183 |
| 2003/0102822 A1 | 6/2003 | Muller |
| 2014/0155008 A1* | 6/2014 | Van Zyl ............ H01J 37/32155 |
| | | 455/120 |
| 2019/0108979 A1* | 4/2019 | Higuchi ............ H01L 21/67069 |
| 2019/0215942 A1* | 7/2019 | Long ..................... H05H 1/46 |
| 2019/0326093 A1* | 10/2019 | Gurov ............... H01J 37/32183 |
| 2021/0210314 A1 | 7/2021 | Wang et al. |
| 2022/0037123 A1* | 2/2022 | Zhang ..................... H03F 3/211 |
| 2023/0123689 A1* | 4/2023 | Kim ..................... H03H 7/38 |
| | | 315/111.21 |

\* cited by examiner

RF GENERATING DEVICE AND SEMICONDUCTOR MANUFACTURING APPARATUS INCLUDING THE SAME

CROSS-REFERENCE TO RELATED APPLICATIONS

This application is based on and claims priority under 35 U.S.C. § 119 to Korean Patent Application No. 10-2021-0140492, filed on Oct. 20, 2021, and Korean Patent Application No. 10-2022-0075018, filed on Jun. 20, 2022, in the Korean Intellectual Property Office, the disclosures of which are incorporated by reference herein in their entirety.

BACKGROUND

The present disclosure relates to a radio frequency (RF) generator, and more particularly, to an RF generator including an impedance converter that converts a load impedance into a target impedance having a target range and a semiconductor manufacturing apparatus including the RF generator.

As semiconductor manufacturing technology advances, ultra-fine process technology has been developed. Among ultra-fine processes, a manufacturing process using plasma, e.g., an etching process, requires RF power supply technology, which is stable and adapts to a load impedance change at a high speed. In a manufacturing process using plasma, impedance matching between a chamber and an RF generating device is needed to reduce RF power reflected from the chamber. The load impedance is changed at a high speed, but the impedance matching speed cannot keep up with the load impedance changing speed. As a result, RF power reflected from a chamber increases, and thus, it is difficult to stably supply RF power. To resolve this problem, the need for RF power supply technology capable of adapting to a load impedance change at a high speed has increased. Therefore, the need for the development of an impedance converter capable of adapting to a load impedance change at a high speed by reducing the variation range of the load impedance has increased.

SUMMARY

Provided are a radio frequency (RF) generating device capable of stably supplying RF power at a high speed by converting a load impedance into a target impedance having a target range by using an impedance converter and a method of operating a semiconductor manufacturing apparatus including the RF generating device.

According to an aspect of an embodiment, an RF generating device for generating RF output signals, includes: a controller configured to generate an RF control signal and a gain control signal; a plurality of RF signal generators, each RF signal generator being configured to generate an RF signal having at least one of a frequency and a phase determined based on the RF control signal; a plurality of RF amplification modules, each RF amplification module being configured to receive the RF signal generated by a corresponding RF signal generator and generate an RF amplification signal by controlling a gain of the RF signal based on the gain control signal; an RF switch module configured to select at least one of the RF amplification signals generated by the RF amplification modules and generate an RF output signal in a form of a multi-level pulse based on the selected at least one of the RF amplification signals; and an impedance converter connected to an electrode of an external load and configured to convert a load impedance into a target impedance having a target range, the load impedance being an impedance of the external load.

According to an aspect of an embodiment, an RF generating device for generating RF output signals, includes: a controller configured to generate an RF control signal and a gain control signal; a plurality of RF signal generators, each RF signal generator being configured to generate an RF signal having at least one of a frequency and a phase determined based on the RF control signal; an RF switch module configured to select at least one of RF signals output from the RF signal generators and generate an RF base signal in a form of a multi-level pulse based on the selected at least one of the RF signals; an RF amplification module configured to generate an RF output signal by adjusting a gain of the RF base signal based on the gain control signal; and an impedance converter connected to an electrode of an external load and configured to convert a load impedance into a target impedance having a target range.

According to an aspect of an embodiment, an RF generating device configured to be connected with an electrode of a plasma chamber, and generate RF power and supply the RF power to the electrode of the plasma chamber, wherein the RF generating device comprises an impedance converter being configured to convert a impedance of the plasma chamber into a target impedance having a target range.

BRIEF DESCRIPTION OF THE DRAWINGS

The above and/or other aspects of the disclosure will be more clearly understood from the following detailed description taken in conjunction with the accompanying drawings in which.

DETAILED DESCRIPTION

Figure 1:
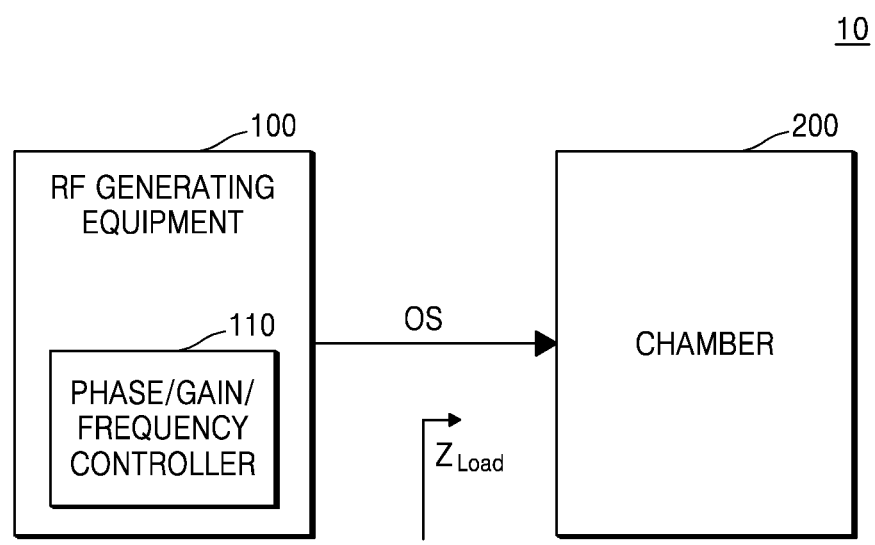
FIG. 1 is a block diagram schematically showing a semiconductor manufacturing apparatus including a radio frequency (RF) generating device and a chamber according to an embodiment.

FIG. 1 is a block diagram schematically showing a semiconductor manufacturing apparatus including a radio frequency (RF) generating device and a chamber according to an embodiment. According to the embodiment, an external load may be a load using RF power. For example, the external load may be a chamber 200 for generating plasma in a semiconductor manufacturing apparatus 10.

Referring to FIG. 1, the semiconductor manufacturing apparatus 10 may include an RF generating device 100 and the chamber 200. As shown in FIG. 1, the RF generating device 100 may generate an output signal OS as RF power and may provide the output signal OS to the chamber 200. Although the RF generating device 100 and the chamber 200 are shown as separated from each other in FIG. 1 to illustrate the output signal OS, the RF generating device 100 and the chamber 200 may be directly connected to each other.

As the semiconductor manufacturing process progresses, the semiconductor manufacturing apparatus 10 may need RF power. For example, a process using plasma may use RF power. A semiconductor manufacturing process, such as an atomic layer etching (ALE) process, an atomic layer deposition (ALD), and a high aspect ratio contact (HARC) etching process, may use plasma, wherein these processes may need RF power to generate and maintain plasma. The semiconductor manufacturing apparatus 10 may supply RF power generated through the RF generating device 100 to the chamber 200 using plasma.

However, a load impedance Zload may vary depending on the state of plasma. When the load impedance Zload is changed, an amount of reflected power in RF power supplied from the RF generating device 100 to the chamber 200 may be changed. To reduce the amount of reflected power, it may be necessary to match the impedance of the chamber 200 with the impedance of the RF generating device 100 according to the state of the load impedance Zload. When a separate matching unit is disposed between the RF generating device 100 and the chamber 200 to match the impedances thereof, the amount of RF power reflected from the chamber 200 may increase due to some elements of the matching unit. Also, the speed at which the load impedance Zload changes may be faster than the speed of matching impedances by the matching unit. Therefore, a technique for converting the load impedance Zload without a separate matching unit may be needed. According to an embodiment of the present disclosure, when the RF generating device 100 and the chamber 200 are directly connected to each other to convert the load impedance Zload without a separate matching unit, the amount of reflected RF power may be reduced, the speed of converting the impedance may be increased, and the density of the semiconductor manufacturing apparatus 10 may be increased.

The RF generating device 100 may include a controller 110 that controls at least one of a phase, a gain, and a frequency of the output signal OS. The RF generating device 100 may control at least one of a phase, a gain, and a frequency of the output signal OS by adapting to a change in the load impedance Zload, thereby controlling the output signal OS at a higher speed than in the case of using a separate matching unit. In addition, the RF generating device 100 may reduce the amount of RF power reflected from the chamber 200 by controlling the output signal OS, and may stably supply the RF power to the chamber 200.

The chamber 200 may be a plasma etching chamber, a plasma enhanced chemical vapor deposition (PECVD) chamber, a plasma deposition chamber, or a plasma enhanced atomic layer deposition (PEALD) chamber. However, the above-described chambers are merely examples of the chamber 200, and the chamber 200 may refer to any chamber using RF power in a semiconductor manufacturing apparatus.

As described below with reference to the drawings, the RF generating device 100 may reduce the load variation of the chamber 200. Also, the RF generating device 100 may supply stable RF power to the chamber 200 and may generate RF power in the form of a multi-level pulse as the output signal OS. In the present disclosure, a multi-level pulse may refer to a signal having two or more amplitude levels.

Figure 2A:
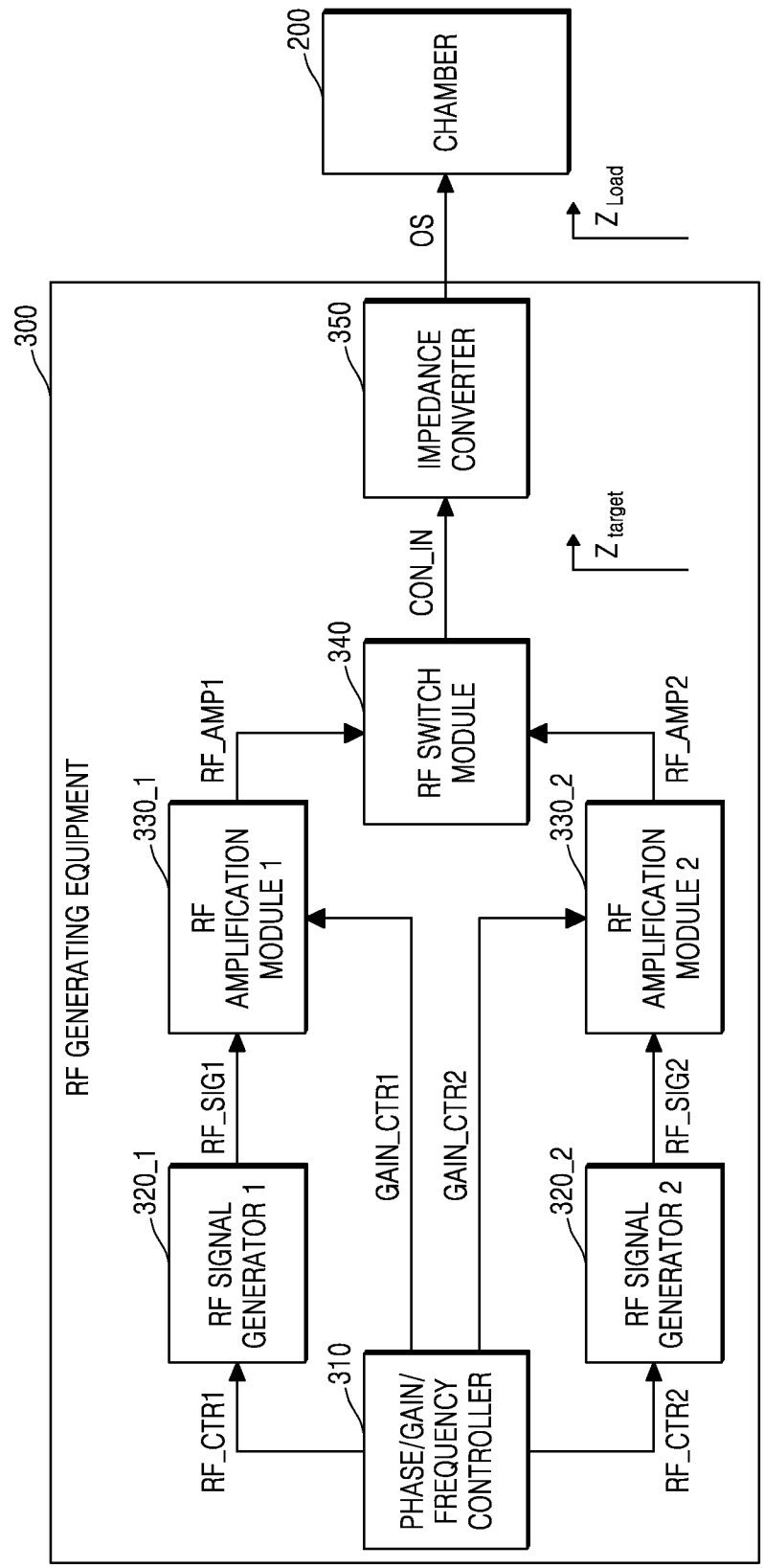
FIGS. 2A and 2B are detailed block diagrams of RF generating devices according to embodiments.
Figure 2B:
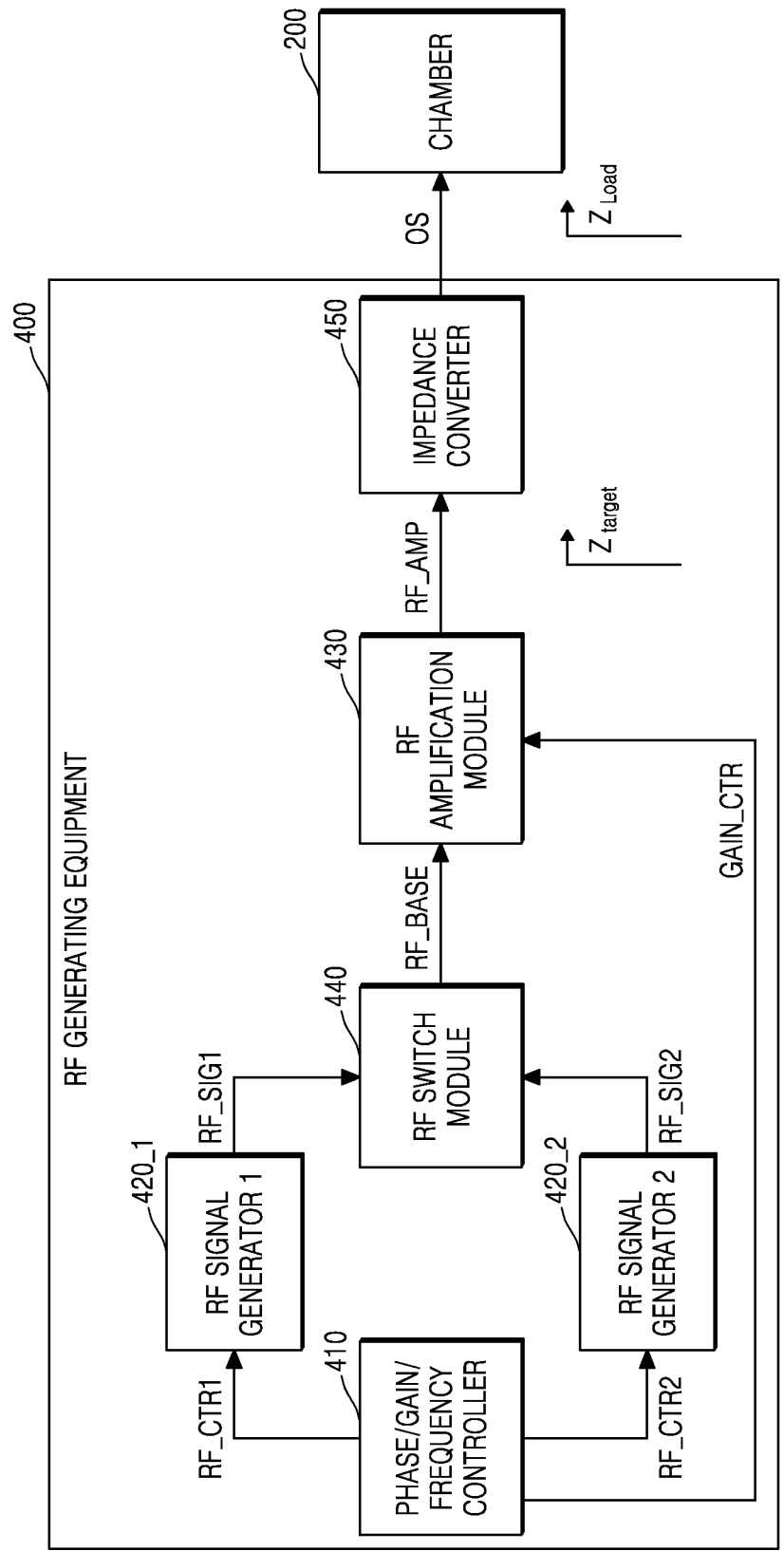

FIGS. 2A and 2B are detailed block diagrams of RF generating devices according to embodiments. FIG. 2A shows a case in which first and second RF amplification signals RF_AMP1 and RF_AMP2 are synthesized or selected by an RF switch module 340 after an RF generating device 300 amplifies first and second RF signals RF_SIG1 and RF_SIG2. FIG. 2B shows a case in which an RF base signal RF_BASE is amplified by an RF amplification module 430 after an RF generating device 400 synthesizes or selects the first and second RF signals RF_SIG1 and RF_SIG2 at an RF switch module 440. Depending on the design of the semiconductor manufacturing apparatus 10, the RF generating device 300 of FIG. 2A or the RF generating device 400 of FIG. 2B may be used. For convenience of explanation, two RF signal generators, that is, first and second RF signal generators 320_1 and 320_2, and two RF amplification modules, that is, first and second RF amplification modules 330_1 and 330_2, are shown in FIG. 2A. However, embodiments of the disclosure not limited thereto, and the RF generating device 300 may include three or more RF signal generators and three or more RF amplification modules.

Referring to FIG. 2A, the RF generating device 300 may include a controller 310, the first and second RF signal generators 320_1 and 320_2, the first and second RF amplification modules 330_1 and 330_2, the RF switch module 340, and an impedance converter 350. Referring to FIG. 2A, a target impedance Ztarget may refer to an impedance measured at an input end of an impedance converter, and the load impedance Zload may refer to an impedance measured at an output end of the impedance converter.

The controller 310 may generate first and second RF control signals RF_CTR1 and RF_CTR2 for controlling phases and frequencies of the first and second RF signals RF_SIG1 and RF_SIG2 generated by the first and second RF signal generators 320_1 and 320_2 and generate first and second gain control signals GAIN_CTR1 and GAIN_CTR2 for controlling gains of the first and second RF amplification modules 330_1 and 330_2. The controller 310 may adapt to a change in the load impedance Zload and adjust the first and second RF control signals RF_CTR1 and RF_CTR2 or the first and second gain control signals GAIN_CTR1 and GAIN_CTR2, thereby changing at least one of a phase, an amplitude, and a frequency of a converter input signal CON_IN. The controller 310 may change the converter input signal CON_IN, such that the impedance converter 350 converts the load impedance Zload into the target impedance Ztarget having a target range.

The controller 310 may control the frequencies of the first and second RF signals RF_SIG1 and RF_SIG2 by adjusting the first and second RF control signals RF_CTR1 and RF_CTR2, for impedance conversion. Also, the controller 310 may control the phases of the first and second RF signals RF_SIG1 and RF_SIG2 by adjusting the first and second RF control signals RF_CTR1 and RF_CTR2, to control the amplitude of the output signal OS.

As the controller 310 controls the amplitude of the output signal OS, the output signal OS in the form of a multi-level pulse may be generated. As described below with reference to FIGS. 4 to 5, when the phases of the first and second RF signals RF_SIG1 and RF_SIG2 are changed, the amplitude of the converter input signal CON_IN generated by the RF switch module 340 may be changed. Also, when the amplitude of the converter input signal CON_IN is changed, the amplitude of the output signal OS may also be changed. As another method of controlling the amplitude of the output signal OS, the controller 310 may adjust the first and second gain control signals GAIN_CTR1 and GAIN_CTR2. In detail, when the controller 310 adjusts the first and second gain control signals GAIN_CTR1 and GAIN_CTR2, the amplitudes of the first and second RF amplification signals RF_AMP1 and RF_AMP2 provided to the RF switch module 340 are changed, and thus, the amplitude of the converter input signal CON_IN may be changed.

The controller 310 may control a quality (Q) factor of the target impedance Ztarget. The Q factor may refer to an index indicating the frequency characteristic of impedance. The Q factor may be defined as a natural frequency with respect to a 3 dB frequency bandwidth. In other words, the Q factor may be expressed as $$\frac{f_0}{BW_{3dB}}.$$

Here, $f_0$ may denote the natural frequency of the target impedance Ztarget. The energy of the converter input signal CON_IN having the frequency $f_0$ may be $E_0$. The 3 dB frequency bandwidth ($BW_{3dB}$) may refer to a bandwidth of a frequency when energy is attenuated by 3 dB as compared to $E_0$.

When the target impedance Ztarget has a high Q factor, the target impedance Ztarget may vary significantly even with a small frequency change. In other words, the target impedance Ztarget may vary significantly depending on a change in the frequency of the converter input signal CON_IN. On the other hand, when the target impedance Ztarget has a low Q factor, even when the frequency of the converter input signal CON_IN is changed, the variation range of the target impedance Ztarget may be small. When the variation range of the target impedance Ztarget is small, the RF generating device 300 may supply stable RF power to the chamber 200.

The controller 310 may control the Q factor through the first and second RF control signals RF_CTR1 and RF_CTR2. The controller 310 may control the impedance converter 350 through the first and second RF control signals RF_CTR1 and RF_CTR2 to convert the load impedance Zload into the target impedance Ztarget. As the controller 310 adjusts the frequency of the converter input signal CON_IN through the first and second RF control signals RF_CTR1 and RF_CTR2, the RF generating device 300 may control the Q factor of the target impedance Ztarget. The controller 310 may stably supply RF power to the chamber 200 by maintaining a low Q factor of the target impedance Ztarget through the first and second RF control signals RF_CTR1 and RF_CTR2.

The first and second RF signal generators 320_1 and 320_2 may generate the first and second RF signals RF_SIG1 and RF_SIG2 having frequencies and phase values based on the first and second RF control signals RF_CTR1 and RF_CTR2, respectively. For example, when a first RF control signal RF_CTR1 has a frequency of 1 kHz and 30° phase information, a first RF signal generator 320_1 may generate a first RF signal RF_SIG1 having a frequency of 1 kHz and a phase of 30° based on the first RF control signal RF_CTR1. In the same regard, when a second RF control signal RF_CTR2 has a frequency of 2 kHz and 60° phase information, a second RF signal generator 320_2 may generate a second RF signal RF_SIG2 having a frequency of 2 kHz and a phase of 60° based on the second RF control signal RF_CTR2.

The first and second RF amplification modules 330_1 and 330_2 may generate the first and second RF amplification signals RF_AMP1 and RF_AMP2 having gain values based on the first and second gain control signals GAIN_CTR1 and GAIN_CTR2, respectively. For example, when a first gain control signal GAIN_CTR1 has gain information of 2, the first RF amplification module 330_1 may generate a first RF amplification signal RF_AMP1 by amplifying power of the first RF signal RF_SIG1 by 2 times based on the first gain control signal GAIN_CTR1. in the same regard, when a second gain control signal GAIN_CTR2 has gain information of 0.5, the second RF amplification module 330_2 may generate a second RF amplification signal RF_AMP2 by amplifying power of the second RF signal RF_SIG2 by 0.5 times based on the second gain control signal GAIN_CTR2.

The RF switch module 340 may select the first and second RF amplification signals RF_AMP1 and RF_AMP2 to generate the converter input signal CON_IN. When the RF switch module 340 selects any one of the first RF amplification signal RF_AMP1 and the second RF amplification signal RF_AMP2, the RF switch module 340 may generate the converter input signal CON_IN having the same waveform as a selected signal. On the other hand, when the RF switch module 340 selects both the first RF amplification signal RF_AMP1 and the second RF amplification signal RF_AMP2, the first and second RF amplification signals RF_AMP1 and RF_AMP2 may be synthesized as described below with reference to FIG. 4, and thus, the converter input signal CON_IN may be generated.

Figure 8:
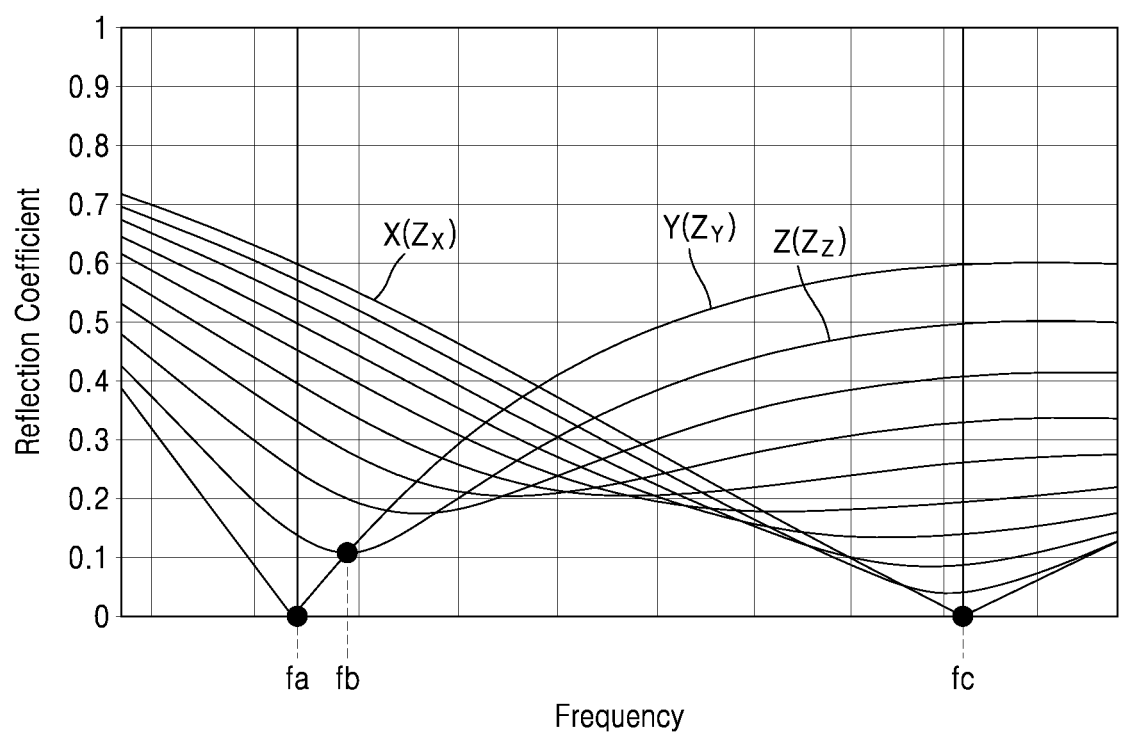
FIG. 8 is a diagram showing relationships between a frequency and a reflection coefficient.
Figure 9A:
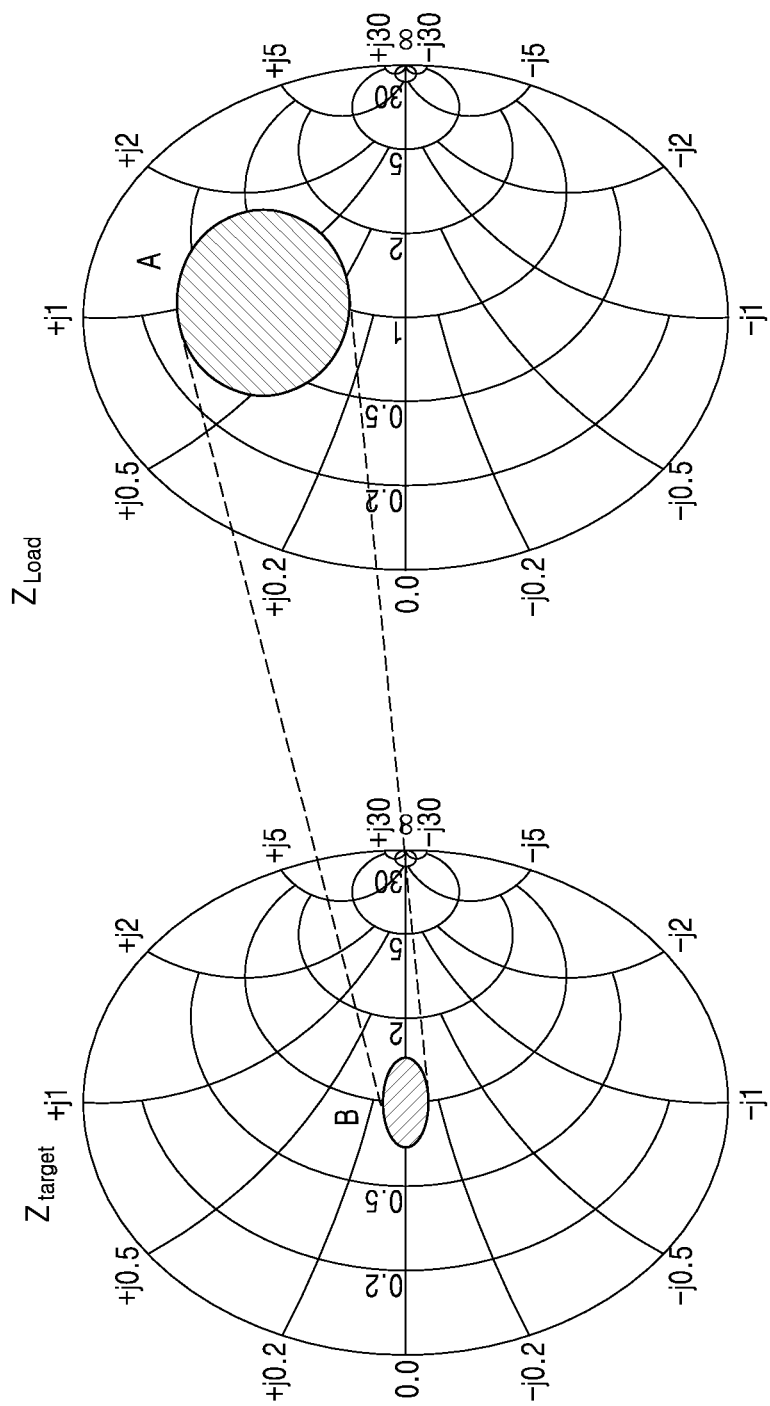
FIGS. 9A and 9B are diagrams showing results of impedance matching according to an embodiment.
Figure 9B:
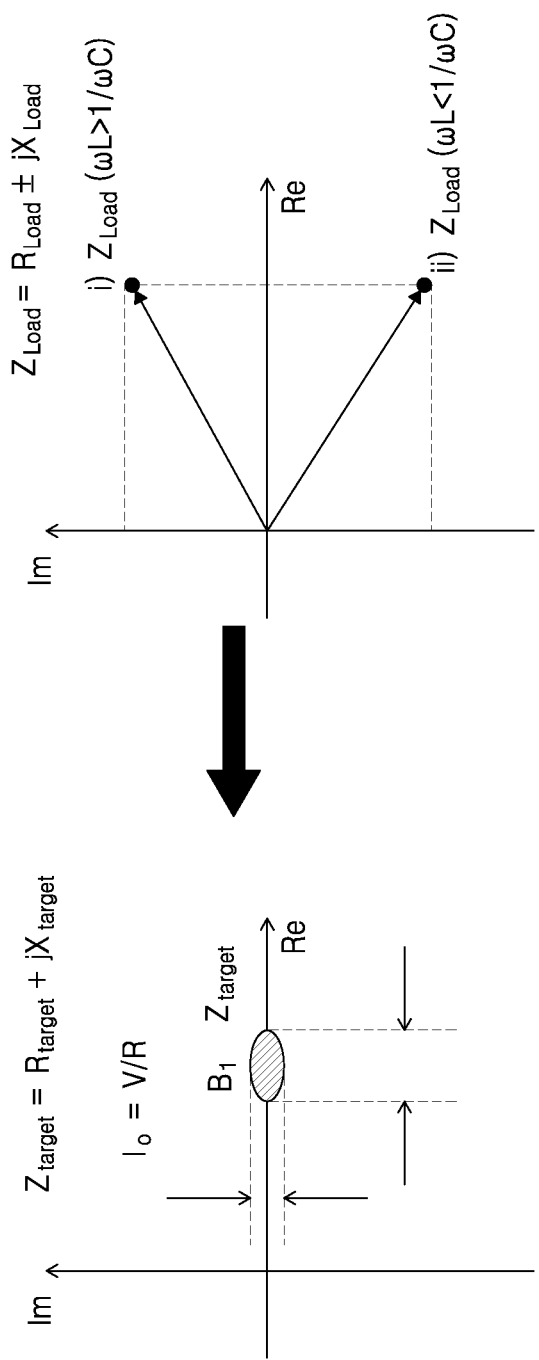

The impedance converter 350 may convert the load impedance Zload into the target impedance Ztarget having a target range, as shown in FIGS. 8, 9A, and 9B. However, as shown in FIG. 8, to convert the load impedance Zload, the frequency of the converter input signal CON_IN may be set to a particular frequency range. The RF generating device 300 may reduce the variation range of the load impedance Zload through the impedance converter 350 and may supply stable RF power to the chamber 200. The impedance converter 350 may include RLC elements including a resistor, an inductor, a capacitor, etc. According to some embodiments, the RLC elements may be fixed elements with fixed resistances, fixed capacitances, and fixed inductances. According to other embodiments, the RLC devices may be variable elements capable of changing resistances, capacitances, and inductances thereof. When the RLC elements are variable elements, the controller 310 may adjust resistances, capacitances, and inductances of the variable elements. When the RLC elements are variable elements, the impedance converter 350 may convert the load impedance Zload of a wide range into the target impedance Ztarget having a target range through the variable elements.

The chamber 200 may receive the output signal OS, which is RF power, from the RF generating device 300 and perform a semiconductor manufacturing process. According to some embodiments, the chamber 200 may be a plasma etching chamber that performs etching by generating plasma with RF power. According to other embodiments, the chamber 200 may be a process chamber that performs a deposition process, such as ALD. Alternatively, the chamber 200 may be any chamber using RF power in a semiconductor manufacturing process.

Referring to FIG. 2B, the RF generating device 400 may include a controller 410, first and second RF signal generators 420_1 and 420_2, the RF amplification module 430, the RF switch module 440, and an impedance converter 450. In FIG. 2A, the first and second RF signals RF_SIG1 and RF_SIG2 are amplified and then synthesized or selected by the RF switch module 340. However, FIG. 2B shows a case where the first and second RF signals RF_SIG1 and RF_SIG2 are amplified by the RF amplification module 430 after being synthesized or selected by the RF switch module 440. Descriptions identical to those given above with reference to FIG. 2A are omitted below except for differences from FIG. 2A. For convenience of explanation, two RF signal generators, that is, the first and second RF signal generators 420_1 and 420_2, are shown in FIG. 2B. However, the inventive concept is not limited thereto, and the RF generating device 400 may include three or more RF signal generators.

The RF switch module 440 may select the first and second RF signals RF_SIG1 and RF_SIG2 and generate the RF base signal RF_BASE. When the RF switch module 440 selects any one of the first RF signal RF_SIG1 and the second RF signal RF_SIG2, the RF switch module 440 may generate the RF base signal RF_BASE having the same waveform as a selected signal. On the other hand, when the RF switch module 440 selects both the first RF signal RF_SIG1 and the second RF signal RF_SIG2, the RF base signal RF_BASE may be generated by synthesizing the first and second RF signals RF_SIG1 and RF_SIG2.

The RF amplification module 430 may generate an RF amplification signal RF_AMP having a gain value based on a gain control signal GAIN_CTR. For example, when the gain control signal GAIN_CTR has gain information of 2, the RF amplification module 430 may generate the RF amplification signal RF_AMP by amplifying power of the RF base signal RF_BASE by 2 times based on the gain control signal GAIN_CTR.

Figure 3:
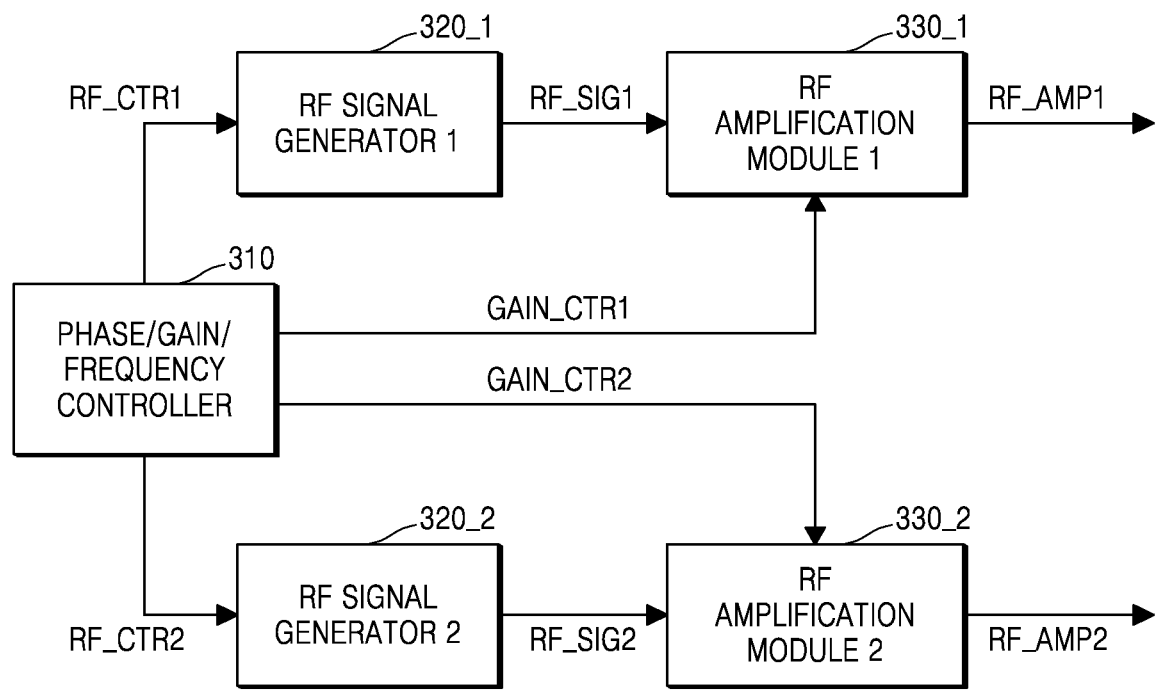
FIG. 3 is a block diagram for describing the operation of a controller.

FIG. 3 is a block diagram for describing the operation of a controller. Although FIG. 3 is described below with reference to the controller 310 of FIG. 2A, FIG. 3 may also be described with reference to the controller 410 of FIG. 2B.

The controller 310 may generate first and second RF control signals RF_CTR1 and RF_CTR2 for controlling phases and frequencies of the first and second RF signals RF_SIG1 and RF_SIG2 generated by the first and second RF signal generators 320_1 and 320_2 and generate first and second gain control signals GAIN_CTR1 and GAIN_CTR2 for controlling gains of the first and second RF amplification modules 330_1 and 330_2.

The first and second RF control signals RF_CTR1 and RF_CTR2 may be signals controlling the phase or frequency of the first and second RF signals RF_SIG1 and RF_SIG2 generated by the first and second RF signal generators 320_1 and 320_2, respectively. The controller 310 may adjust the first and second RF control signals RF_CTR1 and RF_CTR2, such that the load impedance Zload may be converted into the target impedance Ztarget having a target range through an impedance converter (e.g., 350 of FIG. 2). For impedance conversion, the controller 310 may adjust the first and second RF control signals RF_CTR1 and CR_CTR2, such that an RF switch module (e.g., 340 of FIG. 2) generates the converter input signal CON_IN having a particular frequency. Also, the controller 310 may change the phases of the first and second RF signals RF_SIG1 and RF_SIG2 by adjusting the first and second RF control signals RF_CTR1 and RF_CTR2. When the phases of the first and second RF signals RF_SIG1 and RF_SIG2 to be synthesized are changed, the amplitude of the converter input signal CON_IN is also changed. Therefore, the controller 310 may control the amplitude of the output signal OS by adjusting the first and second RF control signals RF_CTR1 and RF_CTR2.

The first and second gain control signals GAIN_CTR1 and GAIN_CTR2 may be signals for controlling gains of the first and second RF amplification modules 330_1 and 330_2, respectively. The controller 310 may adjust the first and second gain control signals GAIN_CTR1 and GAIN_CTR2 to generate the converter input signal CON_IN having a multi-level pulse waveform.

To generate the converter input signal CON_IN, the controller 310 may adjust both the first and second RF control signals RF_CTR1 and RF_CTR2 and the first and second gain control signals GAIN_CTR1 and GAIN_CTR2, thereby controlling the RF switch module 340 to generate the converter input signal CON_IN. Therefore, the controller 310 may control the RF switch module 340 to generate the converter input signal CON_IN by adjusting at least one of the first and second RF control signals RF_CTR1 and RF_CTR2 and the first and second gain control signals GAIN_CTR1 and GAIN_CTR2.

Figure 4:
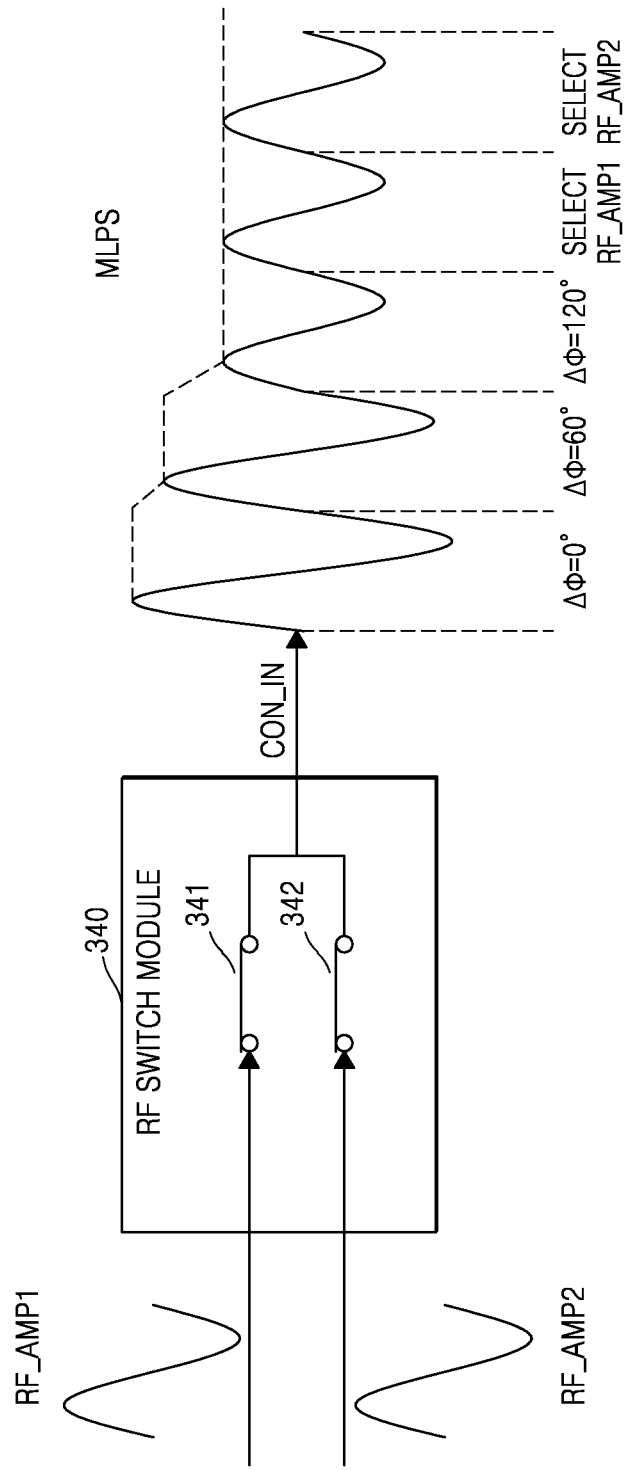
FIG. 4 is a diagram for describing an operation of generating a converter input signal having a multi-level pulse waveform by using an RF switch module according to an embodiment.

FIG. 4 is a diagram for describing an operation of generating a converter input signal having a multi-level pulse waveform by using an RF switch module according to an embodiment. FIG. 4 may be described with reference to FIGS. 2A and 3. Depending on a semiconductor manufacturing process, the chamber 200 may need RF power of various levels. To supply RF power of various levels to the chamber 200, the RF generating device 300 may generate the converter input signal CON_IN in the form of a multi-level pulse signal MLPS.

Figure 6:
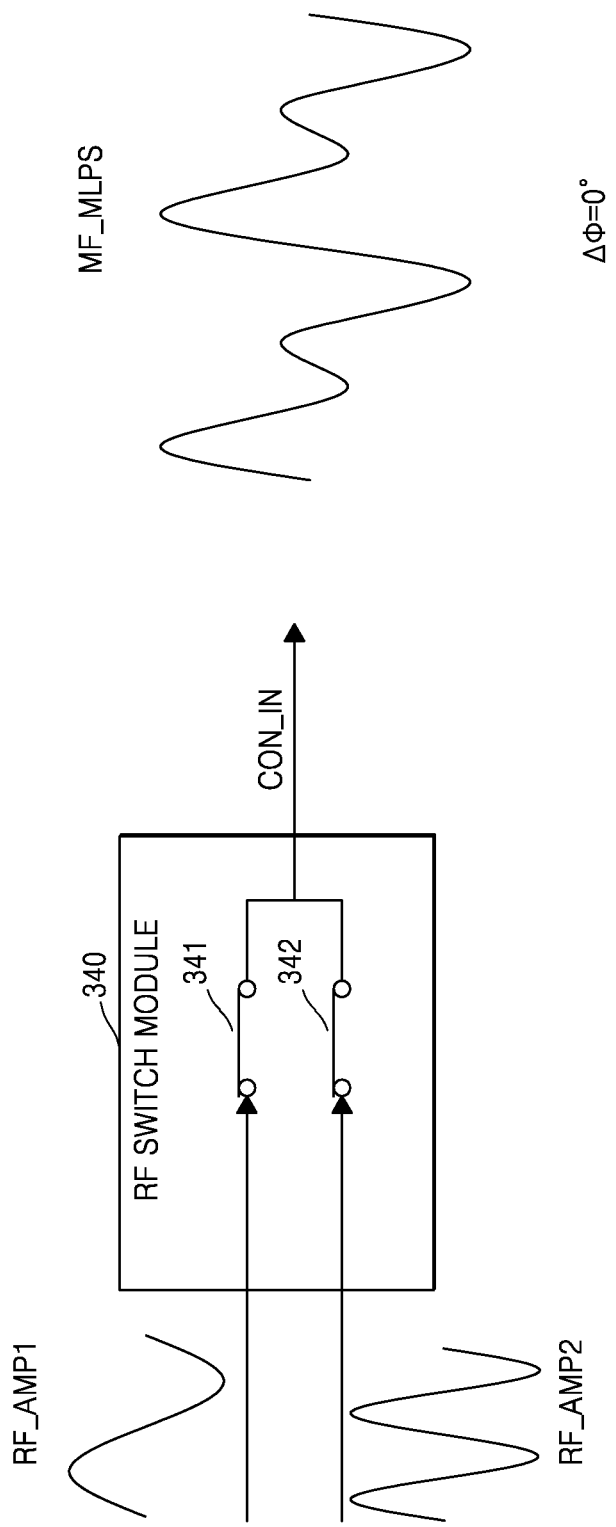
FIG. 6 is a diagram for describing an operation of generating a converter input signal having a multi-frequency multi-level pulse waveform.

The converter input signal CON_IN may be converted into the output signal OS in the form of the multi-level pulse signal MLPS through the impedance converter 350 and transmitted to the chamber 200. For convenience of explanation, FIG. 4 shows a case in which the first and second RF amplification signals RF_AMP1 and RF_AMP2 having the same frequency and the same amplitude are used. For example, the first RF amplification signal RF_AMP1 may be $\sin(a*t+\angle RF1)$, and the second RF amplification signal RF_AMP2 may be $\sin(a*t+\angle RF2)$ (a: a real number greater than or equal to 0, t: time, $\angle RF1$: the phase of the first RF amplification signal RF_AMP1, and $\angle RF2$: the phase of the second RF amplification signal RF_AMP2). However, even when the amplitudes of the first and second RF amplification signals RF_AMP1 and RF_AMP2 are different from each other or when the frequencies of the first and second RF amplification signals RF_AMP1 and RF_AMP2 are different from each other as shown in FIG. 6, the RF switch module 340 may generate the converter input signal CON_IN in the form of the multi-level pulse signal MLPS.

The RF switch module 340 may include a plurality of switches 341 and 342. The switches 341 and 342 may each be a transistor, such as an NMOS transistor, a PMOS transistor, or a BJT. Although two switches 341 and 342 are shown in the RF switch module 340 in FIG. 4, it is merely an example, and the RF switch module 340 may include three or more switches.

Figure 5:
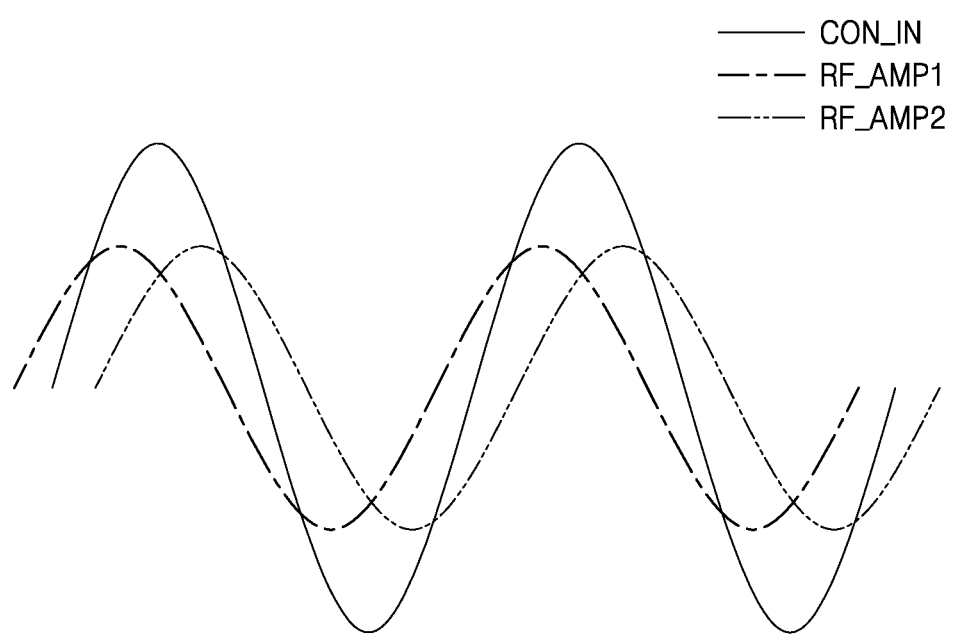
FIG. 5 is a diagram for describing an operation of synthesizing RF signals.

Referring to FIG. 2A, the RF switch module 340 may receive the first and second RF amplification signals RF_AMP1 and RF_AMP2 from the first and second RF amplification modules 330_1 and 330_2. When the RF switch module 340 selects both the first RF amplification signal RF_AMP1 and the second RF amplification signal RF_AMP2, the first and second RF amplification signals RF_AMP1 and RF_AMP2 may be synthesized in the RF switch module 340 as shown in FIG. 5. The first and second RF amplification signals RF_AMP1 and RF_AMP2 having different phases according to the phase information of the first and second RF control signals RF_CTR1 and RF_CTR2 may be synthesized, and thus, the converter input signal CON_IN of the multi-level pulse signal MLPS waveform having different amplitude levels according to phase differences between the first and second RF amplification signals RF_AMP1 and RF_AMP2 to be synthesized may be generated. The phase difference between the first RF amplification signal RF_AMP1 and the second RF amplification signal RF_AMP2 may have various values equal to or greater than 0° and less than 360°.

For example, when the phase difference between the first RF amplification signal RF_AMP1 and the second RF amplification signal RF_AMP2 is 0° (i.e., |∠RF1−∠RF2|=0°), the first and second RF amplification signals RF_AMP1 and RF_AMP2 may be synthesized by the RF switch module 340, and thus, the converter input signal CON_IN having twice the amplitude as compared to each of the first and second RF amplification signals RF_AMP1 and RF_AMP2 may be generated.

For example, when the phase difference between the first RF amplification signal RF_AMP1 and the second RF amplification signal RF_AMP2 is 60° (i.e., |∠RF1−∠RF2|=60°, the first and second RF amplification signals RF_AMP1 and RF_AMP2 may be synthesized by the RF switch module 340, and thus, the converter input signal CON_IN having an amplitude √3 times greater than that of each of the first and second RF amplification signals RF_AMP1 and RF_AMP2 may be generated.

On the other hand, when only any one of the first RF amplification signal RF_AMP1 and the second RF amplification signal RF_AMP2 is selected, the RF switch module 340 may output the same signal as a selected signal as the converter input signal CON_IN.

FIG. 5 is a diagram for describing an operation of synthesizing RF signals. FIG. 5 exemplifies a case in which the phase difference between the first RF amplification signal RF_AMP1 and the second RF amplification signal RF_AMP2 in FIG. 4 is 60° (i.e., |∠RF1−∠RF2|=60°. Although FIG. 5 exemplifies a case in which the phase difference between the first and second RF amplification signals RF_AMP1 and RF_AMP2 having the same amplitude is 60°, it would be obvious to one of ordinary skill in the art that, even when the phase difference is an arbitrary value equal to or greater than 0° and less 360°, the first and second RF amplification signals RF_AMP1 and RF_AMP2 are synthesized in the same manner.

As shown in FIG. 5, the first RF amplification signal RF_AMP1 may be sin(a*t+∠RF1), and the second RF amplification signal RF_AMP2 may be sin(a*t+∠RF2)(a:a real number greater than or equal to 0, t: time, ∠RF1: the phase of the first RF amplification signal RF_AMP1, and ∠RF2: the phase of the second RF amplification signal RF_AMP2). When both the first RF amplification signal RF_AMP1 and the second RF amplification signal RF_AMP2 are selected by the RF switch module 340, the RF amplification signals RF_AMP1 and RF_AMP2 may be synthesized, and thus, the converter input signal CON_IN having a value of sin(a*t+∠RF1)+sin(a*t+∠RF2) may be output. When ∠RF2=∠ RF1+60°, sin(a*t+∠RF1)+sin(a*t+∠RF2) may be expressed as $$\sin(a*t + \angle RF1) + \sin(a*t + \angle RF1 + 60°) =$$
$$\sin(a*t + \angle RF1) + (\sin(a*t + \angle RF1) * \cos(60°) +$$
$$\cos(a*t + \angle RF1) + \sin(60°)) =$$
$$\frac{3}{2}\sin(a*t + \angle RF1) + \frac{\sqrt{3}}{2} * \cos(a*t + \angle RF1) = \sqrt{3} * \sin(a*t + \angle RF1 + \theta)$$

according to the trigonometric addition theorem $$\left(\theta = \tan^{-1}\frac{\sqrt{3}}{3}\right).$$

In other words, the RF switch module 340 synthesizes the first and second RF amplification signals RF_AMP1 and RF_AMP2, and thus, the converter input signal CON_IN having an amplitude times √3 greater than that of each of the first and second RF amplification signals RF_AMP1 and RF_AMP2 may be generated.

When the first and second RF amplification signals RF_AMP1 and RF_AMP2 having the same amplitude have the same phase, the converter input signal CON_IN having twice the amplitude may be generated. On the other hand, when the first and second RF amplification signals RF_AMP1 and RF_AMP2 having the same amplitude have opposite phases, the converter input signal CON_IN having zero amplitude may be generated. Therefore, when the first and second RF amplification signals RF_AMP1 and RF_AMP2 having the same amplitude are synthesized, the converter input signal CON_IN having an amplitude from 0 to 2 times greater than that of each of the first and second RF amplification signals RF_AMP1 and RF_AMP2 may be generated.

FIG. 6 is a diagram for describing an operation of generating a converter input signal having a multi-frequency multi-level pulse waveform. FIG. 6 may be described with reference to FIGS. 2A and 4. Depending on a semiconductor manufacturing process, the chamber 200 may need RF power having multi-frequencies. The RF generating device 300 may generate the converter input signal CON_IN in the form of a multi-frequency multi-level pulse signal MF_MLPS by synthesizing the first and second RF amplification signals RF_AMP1 and RF_AMP2 having different frequencies.

The converter input signal CON_IN may be converted into the output signal OS in the form of the multi-frequency multi-level pulse signal MF_MLPS through the impedance converter 350 and transmitted to the chamber 200. FIG. 4 shows a case in which the second RF amplification signal RF_AMP2 and the first RF amplification signal RF_AMP1 have the same frequency. However, FIG. 6 shows that the frequency of the second RF amplification signal RF_AMP2 is twice the frequency of the first RF amplification signal RF_AMP1. When the frequency of the first RF amplification signal RF_AMP1 is different from the frequency of the second RF amplification signal RF_AMP2, the converter input signal CON_IN in the form of the multi-frequency multi-level pulse signal MF_MLPS may be generated when the first and second RF amplification signals RF_AMP1 and RF_AMP2 are synthesized by the RF switch module 340. FIG. 6 exemplifies a case in which the amplitudes and the phases of the first RF amplification signal RF_AMP1 and the second RF amplification signal RF_AMP2 are the same and only frequencies thereof are different. However, even when the amplitudes of the phases of the first RF amplification signal RF_AMP1 and the second RF amplification signal RF_AMP2 are different from each other, the converter input signal CON_IN in the form of the multi-frequency multi-level pulse signal MF_MLPS may be generated.

Figure 7:
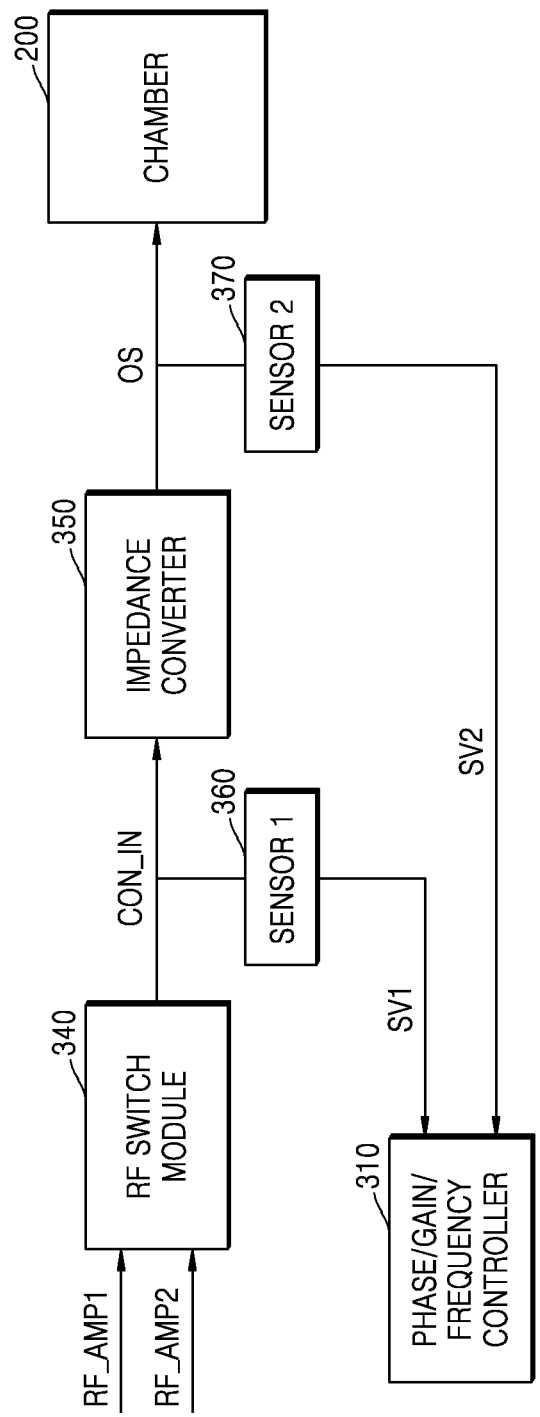
FIG. 7 is a block diagram showing an operation in which sensors around an impedance converter sense values related to signals.

FIG. 7 is a block diagram showing an operation in which sensors around an impedance sense values related to signals. FIG. 7 may be described below with reference to FIG. 2A. The RF generating device 300 of FIG. 2A may further include a first sensor 360 and a second sensor 370. The first sensor 360 may measure the converter input signal CON_IN and may provide a first sensed value SV1 to the controller 310. The second sensor 370 may measure the output signal OS and may provide a second sensed value SV2 to the controller 310.

The first sensed value SV1 may refer to the target impedance Ztarget. According to some embodiments, the first sensor 360 may measure a voltage, a current, and a phase difference between a voltage and a current of the converter input signal CON_IN and calculate the target impedance Ztarget based on the voltage, the current, and the phase difference between the voltage and the current of the converter input signal CON_IN. For example, when the voltage of the converter input signal CON_IN is 5 V, the current of the converter input signal CON_IN is 0.1 A, and the phase difference between the voltage and the current of the converter input signal CON_IN is 0°, the target impedance Ztarget may be calculated as $$\frac{5}{0.1} = 50\Omega.$$

The first sensor 360 may provide the first sensed value SV1 to the controller 310.

The second sensed value SV2 may refer to the load impedance Zload. According to some embodiments, the second sensor 370 may measure a voltage, a current, and a phase difference between a voltage and a current of the output signal OS and calculate the load impedance Zload based on the voltage, the current, and the phase difference between the voltage and the current of the output signal OS. The method by which the second sensor 370 calculates the load impedance Zload may be described with reference to the method by which the first sensor 360 calculates the target impedance Ztarget. The second sensor 370 may provide the second sensed value SV2 to the controller 310. The controller 310 may adjust the first and second RF control signals RF_CTR1 and RF_CTR2 or the first and second gain control signals GAIN_CTR1 and GAIN_CTR2, such that the impedance converter 350 may convert the load impedance Zload into the target impedance Ztarget having a target range, based on the first sensed value SV1 and the second sensed value SV2.

FIG. 8 is a diagram showing relationships between a frequency and a reflection coefficient. FIG. 8 may be described with reference to FIG. 2A described above. Referring to FIG. 8, the horizontal axis may indicate the frequency of the output signal OS, and the vertical axis may indicate a reflection coefficient. According to the inventive concept, the reflection coefficient may be a coefficient indicating a ratio at which the output signal OS output from the RF generating device 300 is reflected from the chamber 200. For example, when the reflection coefficient is 0.1, it may indicate that 10% of the output signal OS output from the RF generating device 300 is reflected from the chamber 200.

The curves shown in FIG. 8 are graphs showing the relationship between the frequency of the output signal OS according to various load impedances Zload and the reflection coefficient. The controller 310 may control the frequency of the output signal OS by adjusting the first and second RF control signals RF_CTR1 and RF_CTR2. The controller 310 may adjust the first and second RF control signals RF_CTR1 and RF_CTR2, such that the reflection coefficient is minimized for each load impedance Zload. For example, for a graph X in which the load impedance Zload is $Z_X$, the reflection coefficient may be minimized when the frequency of the output signal OS is $f_c$. Therefore, the controller 310 may control the first and second RF control signals RF_CTR1 and RF_CTR2, such that the frequency of the output signal OS becomes $f_c$ when the load impedance Zload is $Z_X$. In the same regard, for a graph Y in which the load impedance Zload is $Z_Y$, the controller 310 may adjust the first and second RF control signals RF_CTR1 and RF_CTR2, such that the frequency of the output signal OS becomes $f_a$. For a graph Z in which the load impedance Zload is $Z_Z$, the controller 310 may adjust the first and second RF control signals RF_CTR1 and RF_CTR2, such that the frequency of the output signal OS becomes $f_b$.

When the reflection coefficient is low, the variation of the target impedance Ztarget may be reduced. Therefore, the controller 310 may adjust the first and second RF control signals RF_CTR1 and RF_CTR2 to reduce the variation range of the target impedance Ztarget, thereby minimizing the reflection coefficient of the output signal OS.

FIGS. 9A and 9B are diagrams showing results of impedance matching according to an embodiment. FIGS. 9A and 9B may be described with reference to FIG. 2A described above. FIG. 9A is a diagram showing a result of impedance matching on a Smith chart, and FIG. 9B is a diagram showing a result of impedance matching on an orthogonal coordinate system.

Referring to FIG. 9A, a Smith chart of the target impedance Ztarget and a Smith chart of the load impedance Zload are shown. In the Smith chart of the load impedance Zload, a region A may indicate a region that may become the load impedance Zload. The region A may include load impedances Zload of various graphs of FIG. 8. In the Smith chart of the target impedance Ztarget, a region B may indicate a region that may become the target impedance Ztarget. The region B may be referred to as a target range herein. The target range may be determined based on the load impedance Zload. For example, when the reactance component of the load impedance Zload is large, the target range may be set to have a small resistance.

In other words, the load impedance Zload belonging to the region A may be converted into the target impedance Ztarget of the region B by the impedance converter 350. The region B may be smaller than the region A. Also, the region B may include points corresponding to a zero reactance component, that is, points on the horizontal axis of the Smith chart. To reduce the amount of power reflected from the chamber 200, the load impedance Zload may be converted into the target impedance Ztarget having a zero reactance component.

When the load impedance Zload is converted into the target impedance Ztarget having a smaller range, the RF generating device 300 may supply stable RF power, and, referring to FIG. 8, the amount of power reflected from the chamber 200 may be reduced. Therefore, the RF generating device 300 may efficiently supply RF power to the chamber 200.

Referring to FIG. 9B, the orthogonal coordinate system of the target impedance Ztarget and the orthogonal coordinate system of the load impedance Zload are shown. The load impedance Zload having the value of $Z_{load}=R_{load}\pm jX_{load}$ may be converted into the target impedance Ztarget having the value of $Z_{target}=R_{target}+jX_{target}$. Here, $R_{load}$ and $X_{load}$ may denote the resistance of the load impedance Zload and the reactance of the load impedance Zload, respectively, and $R_{target}$ and $X_{target}$ may denote the resistance of the target impedance Ztarget and the reactance of the target impedance Ztarget, respectively. When $\omega L > 1/\omega C$, the load impedance Zload may be expressed as $Z_{load}=R_{load}+jX_{load}$ having a positive reactance. Here, ω may denote the angular velocity of the output signal OS, L may denote the inductance of the chamber 200, and C may denote the capacitance of the chamber 200. On the other hand, when $\omega L < 1/\omega C$, the load impedance Zload may be expressed as $Z_{load}=R_{load}-jX_{load}$.

The target impedance Ztarget may be included in a region B1. The region B1 may include a region having a zero reactance component. Since the load impedance Zload may be converted into the target impedance Ztarget having a smaller range than the load impedance Zload, the RF generating device 300 may supply stable RF power to the chamber 200 as described with reference to FIG. 9A, and the amount of power reflected from the chamber 200 may be reduced.

Figure 10:
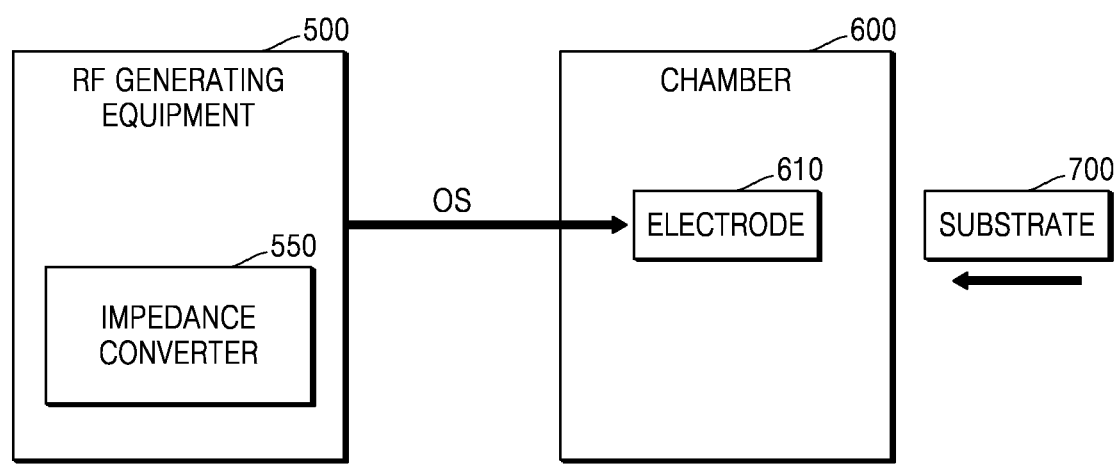
FIG. 10 is a block diagram showing a plasma power source according to an embodiment.

FIG. 10 is a block diagram showing a plasma power source according to an embodiment. A plasma power source 11 may include an RF generating device 500, a chamber 600, and a substrate 700. The RF generating device 500 may include an impedance converter 550 and may correspond to the RF generating devices 300 or 400 described above with reference to FIGS. 2A to 2B.

The substrate 700 may be provided to the chamber 600 for a process, such as deposition. The process, such as deposition, may be a process using plasma. The chamber 600 may need RF power for generation and maintenance of plasma.

The chamber 600 may include an electrode 610 for receiving RF power. The chamber 600 may receive RF power from the RF generating device 500 through the electrode 610.

Since the RF generating device 500 may convert the load impedance Zload into the target impedance Ztarget having a smaller range through the impedance converter 550, RF power may be stably supplied to the chamber 600.

While the inventive concept has been particularly shown and described with reference to embodiments thereof, it will be understood that various changes in form and details may be made therein without departing from the spirit and scope of the following claims.

What is claimed is:

1. A radio frequency (RF) generating device for generating RF output signals, the RF generating device comprising:
a controller configured to generate an RF control signal and a gain control signal;
a plurality of RF signal generators, each RF signal generator being configured to generate an RF signal having at least one of a frequency and a phase determined based on the RF control signal;
a plurality of RF amplification modules, each RF amplification module being configured to receive the RF signal generated by a corresponding RF signal generator and generate an RF amplification signal by controlling a gain of the RF signal based on the gain control signal;
an RF switch module configured to select at least one of the RF amplification signals generated by the plurality of RF amplification modules and generate an RF output signal in a form of a multi-level pulse based on the selected at least one of the RF amplification signals; and
an impedance converter connected to an electrode of an external load and configured to convert a load impedance into a target impedance having a target range, the load impedance being an impedance of the external load,
wherein the controller is further configured to adjust at least one the RF control signal and the gain control signal based on the target impedance.

2. The RF generating device of claim 1, wherein the controller is further configured to control a quality factor of the target impedance by adjusting the RF control signal.

3. The RF generating device of claim 1, wherein the target range is set based on the load impedance.

4. The RF generating device of claim 1, wherein the target range is narrower than a range in which the load impedance is changed.

5. The RF generating device of claim 1, wherein the controller is further configured to adjust at least one of the RF control signal and the gain control signal to control the impedance converter to convert the load impedance into the target impedance.

6. The RF generating device of claim 1, wherein the target range comprises a region having a zero reactance component.

7. The RF generating device of claim 1, further comprising a first sensor configured to measure the target impedance to obtain a first sensed value obtained and provide the first sensed value to the controller,
wherein the controller is further configured to adjust at least one of the RF control signal and the gain control signal based on the first sensed value.

8. The RF generating device of claim 7, further comprising a second sensor configured to measure the load impedance to obtain a second sensed value and provide the load impedance to the controller,
wherein the controller is further configured to adjust the at least one of the RF control signal and the gain control signal based on the first sensed value and the second sensed value.

9. The RF generating device of claim 1, wherein the RF switch module is further configured to select at least two of the RF amplification signals and generate the RF output signal in the form of the multi-level pulse based on the selected at least two RF amplification signals.

10. The RF generating device of claim 1, wherein the external load comprises a load of a plasma chamber.

11. A radio frequency (RF) generating device for generating RF output signals, the RF generating device comprising:
a controller configured to generate an RF control signal and a gain control signal;
a plurality of RF signal generators, each RF signal generator being configured to generate an RF signal having at least one of a frequency and a phase determined based on the RF control signal;
an RF switch module configured to select at least one of RF signals output from the plurality of RF signal generators and generate an RF base signal in a form of a multi-level pulse based on the selected at least one of the RF signals;
an RF amplification module configured to generate an RF output signal by adjusting a gain of the RF base signal based on the gain control signal; and an impedance converter connected to an electrode of an external load and configured to convert a load impedance into a target impedance having a target range, wherein the controller is further configured to adjust at least one of the RF control signal and the gain control signal based on the target impedance.

12. The RF generating device of claim 11, wherein the controller is further configured to control a quality factor of the target impedance by adjusting at least one of the RF control signal and the gain control signal.

13. The RF generating device of claim 11, wherein the target range is set based on the load impedance.

14. The RF generating device of claim 11, wherein the target range is narrower than a range in which the load impedance is changed.

15. The RF generating device of claim 11, wherein the controller is further configured to adjust at least one of the RF control signal and the gain control signal to control the impedance converter to convert the load impedance into the target impedance.

16. The RF generating device of claim 11, further comprising a first sensor configured to measure the RF output signal to obtain a first sensed value obtained and provide the first sensed value to the controller, wherein the controller is further configured to adjust at least one of the RF control signal and the gain control signal based on the first sensed value.

17. The RF generating device of claim 16, further comprising a second sensor configured to measure the load impedance to obtain a second sensed value and provide the second sensed value to the controller, wherein the controller is further configured to adjust the at least one of the RF control signal and the gain control signal based on the first sensed value and the second sensed value.

* * * * *